United States Patent [19]

Huijsing

[11] Patent Number: 4,808,846

[45] Date of Patent: Feb. 28, 1989

[54] BRIDGE-TO-FREQUENCY CONVERTER

[75] Inventor: Johan H. Huijsing, Schipluiden, Netherlands

[73] Assignee: North American Philips Corporation, Signetics Division, Sunnyvale, Calif.

[21] Appl. No.: 907,295

[22] Filed: Sep. 12, 1986

[51] Int. Cl.[4] .......................... H03K 13/02; H03L 7/00
[52] U.S. Cl. ..................................... 307/271; 307/236; 307/228; 328/150
[58] Field of Search ............... 307/271, 519, 236, 228; 328/135, 150

[56] References Cited

U.S. PATENT DOCUMENTS

| 3,419,784 | 12/1968 | Winn | 307/271 |
| 3,800,300 | 3/1974 | Van Oostehout | 340/207 R |
| 4,031,532 | 6/1977 | First | 307/271 |
| 4,115,767 | 9/1978 | Brosh et al. | 307/271 |
| 4,296,413 | 10/1981 | Milkovic | 340/870.38 |

FOREIGN PATENT DOCUMENTS 2312858 9/1974 Fed. Rep. of Germany .

OTHER PUBLICATIONS

"A New Resistance-to-Frequency Converter for Temperature Measurements in Calorimeters", Friedl et al., IEEE Transactions on Instrumentation and Measurement, vol. IM24, No. 4, 12/75.

"Simple and Accurate Strain Gauge Signal to Frequency Converter", by Tadeusz Sider, 1983, The Institute of Physics.

"Monolithic Nullor-A Universal Active Network Element", J. Huijsing et al., Journal Solid State Circuits, vol. SC12, No. 1, Feb. 1977.

Primary Examiner—Stanley D. Miller
Assistant Examiner—Richard Roseen
Attorney, Agent, or Firm—R. Meetin; D. Treacy; T. Briody

[57] ABSTRACT

A signal-conditioning circuit provides an output signal ($V_O$) at a frequency representative of an effect such as strain or temperature that acts on a resistance bridge (20) preferably arranged in a Wheatstone configuration. A pair of energizing voltages ($V_{E1}$ and $V_{E2}$) are supplied on corresponding lines (21 and 22) to energize the bridge. The signal-conditioning circuit contains an integrator (34 and C1), a comparator that compares the integrator output voltage ($V_I$) with one of the energizing voltages ($V_{E2}$), and switching circuitry (23 and 24) that suitably switches the polarity of the energizing voltages in response to the output voltage.

15 Claims, 4 Drawing Sheets

PRIOR ART

BRIDGE-TO-FREQUENCY CONVERTER

FIELD OF USE

This invention relates generally to measurement devices and, in particular, to signal-conditioning circuits in which a pair of signals taken from a resistance bridge subject to an effect that causes certain of its resistors to change value are converted into an output signal at a frequency representative of the effect.

BACKGROUND ART

Electrical resistance varies with temperature and strain. This phenomenon underlies the operation of a bridge transducer used for measuring an effect such as strain or temperature. The transducer contains an electrically activated sensing bridge and a signal-conditioning portion. The bridge is formed with a group of resistors, of which one or more are subjected to the effect being measured. A pair of signals representative of the change in resistance due to the effect are taken from suitable points on the bridge. The signal-conditioning circuit converts the bridge signals into a suitable output form.

A particularly useful type of bridge transducer circuit provides the output signal at a frequency corresponding to the value of the effect under measurement. Friedl et al disclose such a device in "A New Resistance-to-Frequency Converter for Temperature Measurements in Calorimeters", *IEEE Transactions on Instrumentation and Measurement*, Dec. 1975, pp. 322-324. FIG. 1 illustrates the basic circuitry features of this device.

The six resistors shown in FIG. 1 form a bridge 10 energized by variable voltages $V_{E1}$ and $V_{E2}$ supplied on lines 11 and 12. Bridge resistors RT1 and RT2 are placed in an environment whose temperature is under investigation. A voltage $V_B$ is taken at the node between the two equal-value resistors RV. With the node between the two equal-value resistors RR connected to a fixed voltage point (ground reference), voltages $V_B$ and $V_{E1}$ (or $V_{E2}$) are representative of the temperature(s) acting on resistors RT1 and RT2.

An integrator consisting of a capacitor CO connected across a high-grain amplifier 13 integrates a charging current $I_C$ generated from voltages $V_B$ and $V_{E1}$ to produce an integrated voltage $V_I$. A comparator 14 compares voltage $V_I$ with a voltage $V_R$ taken at the node between resistor RT2 and lower resistor RR to produce an output voltage $V_O$ representative of the comparison. Voltage $V_O$ controls the positions of switches 15 and 16 which appropriately connect lines 11 and 12 to supply lines 17 and 18. A floating power supply 19 differentially provides lines 17 and 18 with a bridge supply voltage $V_{BS}$.

The operation of this transducer can be understood with the assistance of FIG. 2. The energizing voltage difference $V_{E1}-V_{E2}$ is termed $V_E$. If switches 15 and 16 are at the positions indicated in FIG. 1 so as to connect lines 11 and 12 respectively to lines 17 and 18, $V_E$ is approximately $V_{BS}$. $V_R$ is at a negative value $-U_R$. $I_C$ flows into capacitor CO, causing $V_I$ to decrease during a time $t_D$ as shown in FIG. 2.

When $V_I$ falls just below $-U_R$, $V_O$ changes polarity. This causes switches 15 and 16 to reverse their positions. Lines 11 and 12 are now respectively connected to lines 18 and 17 to reverse the $V_E$ polarity, thereby reversing the polarities of $V_R$ and $I_C$. $V_I$ rises during a time $t_U$. When $V_I$ passes $U_R$, $V_O$ returns to its original polarity to restart the cycle. The $V_O$ switching frequency is proportional to the difference between the values of resistors RT1 and RT2.

The transducer of Friedl et al appears quite accurate. However, implementing the signal-conditioning portion of the device as a semiconductor integrated circuit can become quite complex because power supply 19 is a "floating" supply. Furthermore, the transducer is a four-wire system since a pair of supply lines (not shown) separate from lines 17 and 18 are needed to provide a supply voltage for components 13 and 14.

GENERAL DISCLOSURE OF THE INVENTION

In accordance with the invention, a signal-conditioning circuit employed with a resistance bridge to form a measurement transducer provides an output signal at frequency representative of an effect such as temperature or strain that acts on the bridge. The transducer can also be used for measuring light intensity, radiation intensity, magnetic-field strength, and certain chemical reaction parameters.

More particularly, the bridge provides a pair of bridge signals representative of the change in bridge resistance due to the effect being measured. The bridge is energized by first and second energizing voltages respectively supplied on first and second energizing lines. The bridge is preferably arranged in a standard Wheatstone configuration in which a first resistor is connected between the first energizing line and a first node, a second resistor is connected between the first node and the second energizing line, a third resistor is connected between the first energizing line and a second node, and a fourth resistor is connected between a second node and the second energizing line. The bridge signals are taken from the nodes.

In the signal-conditioning circuit, an integrator integrates a charging current generated from the bridge signals to produce an integrated voltage. A comparator compares the integrated voltage with the second energizing voltage to produce an output voltage representative of the comparison. A main supply voltage is transmitted between first and second main supply lines. Switching circuitry responsive to the output voltage couples the first and second energizing lines respectively to the first and second supply lines when the output voltage is greater than the second energizing voltage and vice versa. These couplings are thus switched when the output voltage passes the second energizing voltage so as to switch the polarity of the energizing voltage difference. The polarity of the charging current varies with the polarity of the energizing voltage difference. Consequently, the value of the output frequency is representative of the effect under measurement.

The integrator preferably contains a capacitive element and a high-gain amplifier having an output that provides the integrated voltage. The amplifier forces the voltage at its inverting input to closely approach the voltage at its non-inverting input. The voltage at the inverting input is representative of one of the bridge signals. This can be achieved, for example, by respectively connecting the nodes to the amplifier inputs. The capacitive element is coupled between the amaplifier output and the inverting input to receive the charging current.

If a further supply voltage having a magnitude greater than the main supply voltage is differentially supplied from a pair of further supply lines to the integrator and comparator, the circuit can be made into a two-wire system by including voltage reduction circuitry that converts the further supply voltage into the main supply voltage. A resistor is then coupled between the comparator output and one of the further supply lines to provide it with a signal current at the output frequency.

The instant circuit utilizes a relatively small number of components. There is no need for "floating" power supplies or precision references. Consequently, the circuit can be readily implemented in integrated circuit form. Only one power supply is needed. The sensitivity to changes in bridge resistance is very high.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 1:
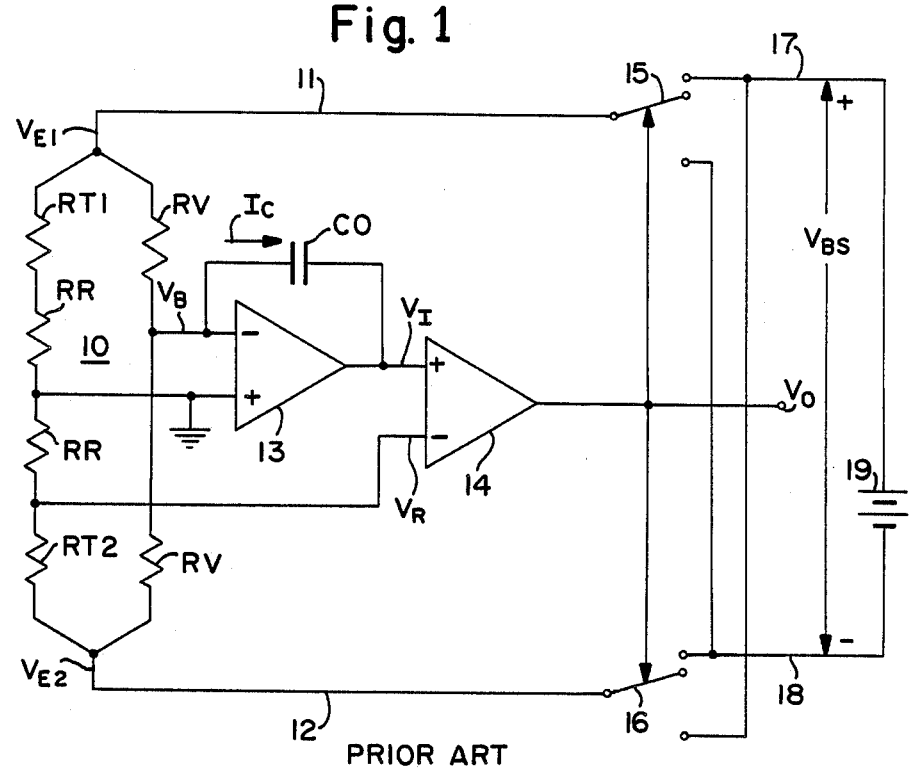
FIG. 1 is a block diagram of a prior art resistance-to-frequency converter.
Figure 2:
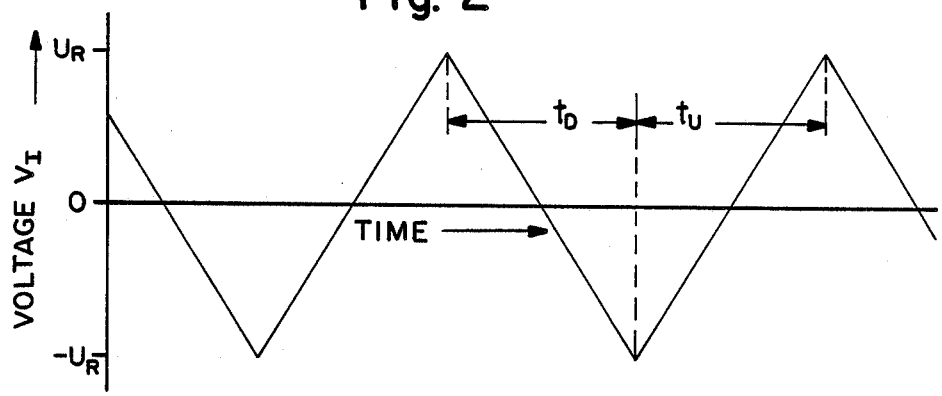
FIG. 2 is a graph of the integrated voltage as a function of time for the transducer of FIG. 1.
Figure 3:
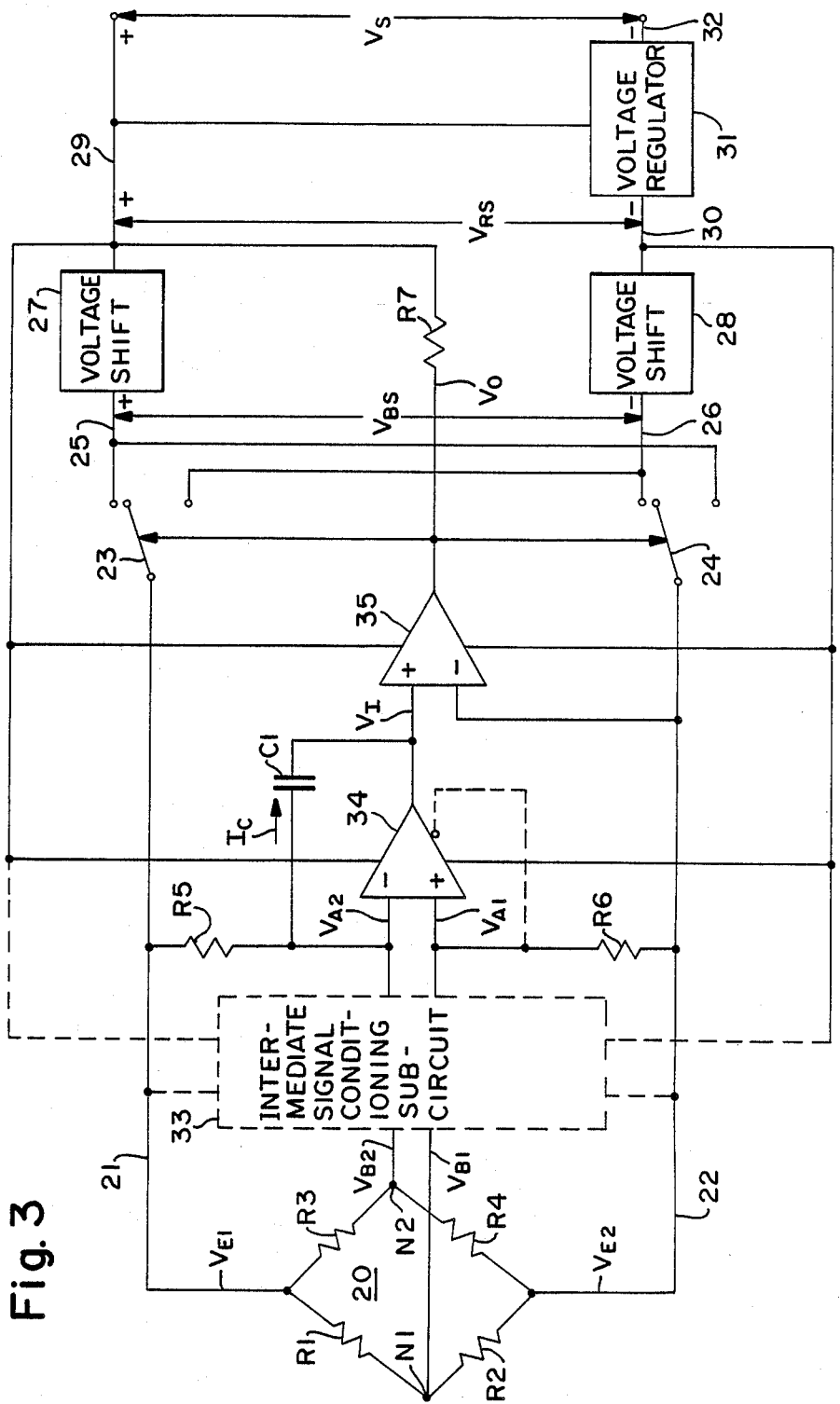
FIG. 3 is a block diagram of a bridge resistance-to-frequency converter in accordance with the invention.

Referring to FIG. 3, it illustrates a measurement transducer in which a signal-conditioning circuit provides output voltage $V_O$ at a frequency representative of the value of an effect such as temperature or strain that "acts" on a Wheatstone bridge 20. The signal-conditioning circuit consists of the components lying to the right of sensor bridge 20 in FIG. 3.

Lines 21 and 22 respectively transmit voltages $V_{E1}$ and $V_{E2}$ to energize bridge 20. Voltage $V_O$ switches between a high-voltage level and a low-voltage level to control the positions of switches 23 and 24 in the signal-conditioning circuit. If $V_O$ is at its high level, switches 23 and 24 connect lines 21 and 22 respectively to positive and negative internal supply lines 25 and 26 that differentially transmit supply voltages $V_{BS}$. Switches 23 and 24 connect lines 21 and 22 respectively to lines 26 and 25 when $V_O$ is at its low level.

Voltage shifting elements 27 and 28 provide voltage $V_{BS}$ by reducing the magnitude of a regulated supply voltage $V_{RS}$ transmitted between respective positive and negative supply lines 29 and 30. Elements 27 and 28 operate symmetrically in that element 27 supplies lines 25 with a voltage that is a given amount lower than that on line 29, while element 28 supplies line 26 with a voltage that is the same amount higher than that on line 30. A voltage regulator 31 regulates an external supply voltage $V_S$ provided between external line 29 and another external supply line 32 to produce voltage $V_{RS}$ at a largely constant value, typically in the range of 12-24 volts. Components 27, 28, and 31 are internally configured according to techniques known in the circuitry art.

For example, each voltage shift 27 or 28 is preferably a group of PN diodes connected in series.

Bridge 20 is formed with resistors R1, R2, R3, and R4 connected through nodes N1 and N2 between lines 21 and 22. The effect under measurement may act on any one or more (up to all four) of resistors R1–R4. Nodes N1 and N2 respectively provide bridge voltages $V_{B1}$ and $V_{B2}$ that are representative of the change in bridge resistance due to the effect being measured.

An optional intermediate signal-conditioning sub-circuit 33 energized by voltage $V_{RS}$ transforms voltages $V_{B1}$ and $V_{B2}$ into voltages $V_{A1}$ and $V_{A2}$ at desired voltage/current levels by a transfer operation such as voltage amplification or voltage-to-current conversion. Sub-circuit 33 may also be energized by voltages $V_{E1}$ and $V_{E2}$. If sub-circuit 33 is absent, $V_{A1}$ is $V_{B1}$, and $V_{A2}$ is $V_{B2}$.

An integrater capacitively integrates charging current $I_C$ generated from voltages $B_{B1}$ and $V_{B2}$ to produce integrated voltage $V_I$. The integrator contains a capacitor C1 and an amplifier 34 energized by voltage $V_{RS}$. Voltages $V_{A1}$ and $V_{A2}$ are respectively supplied to the non-inverting and inverting inputs of amplifier 34 whose non-inverting output provides voltage $V_I$ at a current nearly equal to $I_C$. Capacitor C1 is connected between the inverting input of amplifier 34 and its non-inverting output to receive current $I_C$ which is at voltage $V_{A2}$.

Amplifier 34 has a high input impedance and a low output impedance. The amplifier gain is very high, preferably $10^4$ or more, thereby forcing voltages $V_{A1}$ and $V_{A2}$ to closely approach each other. Amplifier 34 may be a conventional type of operational amplifier ("op amp"). Alternatively, amplifier 34 may be an op amp of the "floating" type described in Huijsing et al, "Monolithic Nullor—A Universal Active Network Element," *IEEE JSSC*, Feb. 1977, pp. 59—64. In this case, amplifier 34 has an inverting output for providing a current that is substantially equal in magnitude to the current at the non-inverting output but flows in the opposite direction. The inverting output is connected back to the non-inverting input.

The integrator typically includes a resistor R5 connected between line 21 and the inverting input of amplifier 34. Another resistor R6 may be connected between line 22 and the non-inverting input. Resistors R5 and R6 are preferably equal in value. They help to establish a center point for the $V_O$ frequency, particularly when there is no initial bridge imbalance.

A comparator 35 energized by voltage $V_{RS}$ compares voltage $V_I$ with voltage $V_{E2}$ to produce voltage $V_O$ at the comparator (35) output. $V_O$ is supplied at its high level when $V_I$ is greater than $V_{E2}$ and vice versa. A resistor R7 connected between the comparator output and line 29 impresses a signal current at the output frequency on line 29.

The transducer of FIG. 3 operates in the following way. Let $V_E$ again be $V_{E1} - V_{E2}$. Assume that $V_I$ is initially greater than $V_{E2}$ so that switches 23 and 24 are at the positions indicated in FIG. 3. $V_E$ equals $V_{BS}$ minus the small voltage drops that occur across switches 23 and 24. That is, $V_E$ approximately equals $V_{BS}$. $V_{E2}$ is less than $V_{E1}$. $V_{B2}$ lies between $V_{E1}$ and $V_{E2}$ at a positive value compared to $V_{E2}$, causing $V_{A2}$ to have the same relationship with respect to $V_{E1}$ and $V_{E2}$. $I_C$ then flows in the direction indicated in FIG. 3.

Figure 4:
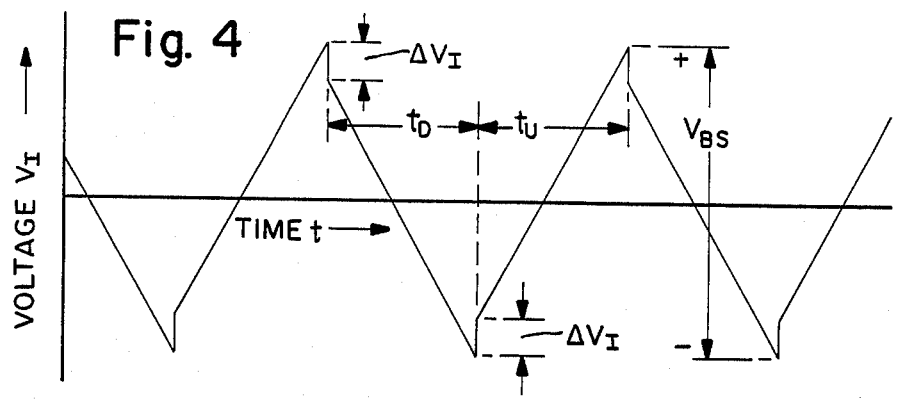
FIG. 4 is a graph of the integrated voltage as a function of time for the converter of FIG. 3.

With reference to FIG. 4 which generally shows how $V_I$ varies with time, the voltage across capacitor C1 increases at a largely linear rate. This causes $V_I$ to fall at a largely constant slope during time $t_D$. When $V_I$ drops just below $V_{E2}$, $V_O$ switches to its low value. In response, switches 23 and 24 reverse their positions. $V_E$ is now approximately equal to $-V_{BS}$ since lines 21 and 22 are respectively connected to lines 26 and 25. $V_{E2}$ is greater than $V_{E1}$.

With suitable choice for the values of the transducer parameters, the actual values of voltages $V_{B2}$ and $V_{A2}$ change little during switching. (The same applies to $V_{B1}$ and $V_{A1}$.) However, $V_{B2}$ is now at a negative value relative to $V_{E2}$ since $V_{E1}$ is less than $V_{E2}$. Accordingly, $V_{A2}$ lies between $V_{E1}$ and $V_{E2}$ at a negative value relative to $V_{E2}$. $I_C$ flows out of capacitor C1, enabling $V_I$ to increase at a largely constant rate during time $t_U$, as indicated in FIG. 4. When $V_I$ rises just above $V_{E2}$, $V_O$ returns to its high level. The cycle then repeats as switches 23 and 24 go back to their original positions.

In some cases, a largely instantaneous shift $\Delta V_I$ in voltage $V_I$ occurs at the beginning of time $t_D$. In such cases, a substantially equal, but oppositely directed, voltage shift $\Delta V_I$ occurs at the beginning of time $t_U$. See FIG. 4.

The frequency f at which voltage $V_O$ switches is equal to a center frequency $f_O$ plus a frequency increment $\Delta f$ which represents the amount of bridge imbalance caused by the effect being measured. In general, $f_O$ depends on resistors R1-R6. If bridge 20 has an initial imbalance, $f_O$ can be established solely by resistors R1-R4. Neither resistor R5 nor resistor R6 need be present.

The nominal values of resistors R1-R4—i.e., their values when the effect under measurement is at a baseline value (e.g., standard temperature or zero strain) and resistors R1-R4 are all subject to the same conditions (including that of the effect being measured)—are typically chosen to be the same so that bridge 20 has no initial imbalance. In this case, at least one of resistors R5 and R6 must normally be present to help establish $f_O$.

An $I_C$ increase during one of times $t_D$ and $t_U$ as a result of the input offset voltage of amplifier 34 is compensated by an $I_C$ decrease during the other of time $t_D$ and $t_U$. Accordingly, the offset voltage of amplifier 34 has only a second-order effect on f. The same applies to any differences in the voltage losses across switches 23 and 24. The input offset voltage of comparator 35 causes substantially no frequency error.

Due to the various forms that sub-circuit 33 can take (if present), it is difficult to give a general expression for f. Several examples are helpful.

Figure 5A:
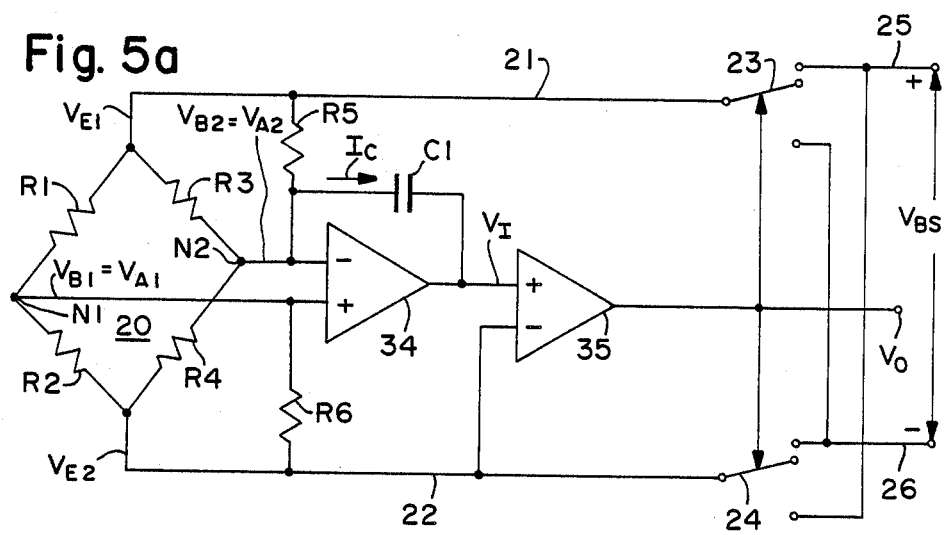
FIGS. 5a and 5b are circuit diagrams for embodiments of the converter of FIG. 3 in which there is no intermediate transfer operation.
Figure 5B:
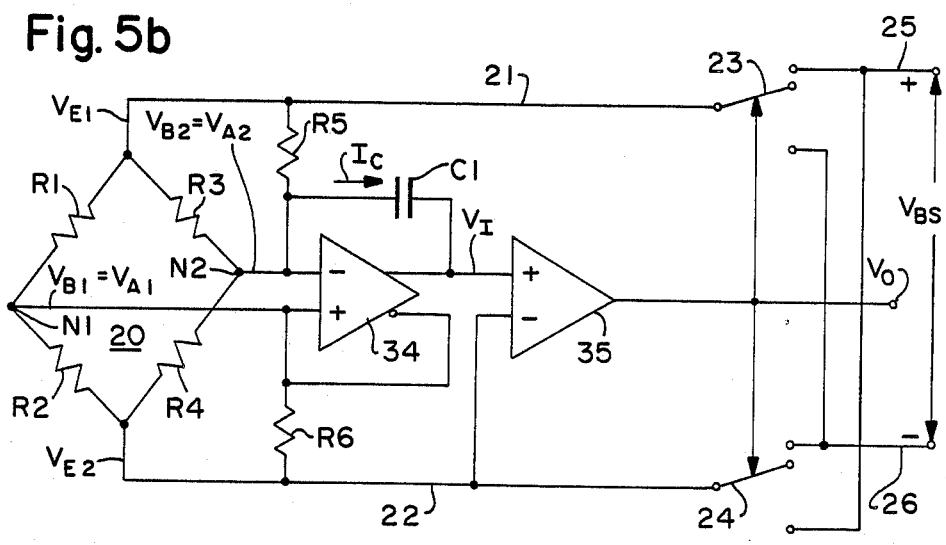

FIGS. 5a and 5b depict embodiments of FIG. 3 in which nodes N1 and N2 are connected respectively to the non-inverting and inverting inputs of amplifier 34. In FIG. 5a, amplifier 34 is a conventional op amp. Amplifier 34 in FIG. 5b is a floating op amp of the type described above.

In calculating the operational relationships for the present transducer, it is assumed that amplifier 34 forces the difference between voltages $V_{A1}$ and $V_{A2}$ essentially to zero. Application of the appropriate current/voltage equations leads to the following relationships for FIG. 5a:

$$I_C \approx \left(\frac{R_1}{R_{3P}} - \frac{R_{2P}}{R_4}\right)\frac{V_{BS}}{(R_1 + R_{2P})} \quad (1)$$

$$f \approx \frac{1}{4R_{2P}C_1}\left(\frac{R_1}{R_{3P}} - \frac{R_{2P}}{R_4}\right) \quad (2)$$

where $R_{3P} = R_3R_5/(R_3+R_5)$, $R_{2P} = R_2R_6/(R_2+R_6)$, and $C_1$, $R_1$, $R_2$, $R_3$, $R_4$, $R_5$, and $R_6$ are the respective values of elements C1 and R1-R6. While $I_C$ varies with $V_{BS}$, f is independent of $V_{BS}$.

In the preferred case, each of R1-R4 is about 120 ohms. R5 and R6 are each 12 kiloohms. If C1 is slightly more than 4 nanofarads, $f_O$ is approximately 10 kilohertz for FIG. 5a. The sensitivity is very high. For a relative change of $10^{-6}$ in one of R1-R4, f is about 0.5 hertz. Largely the same results arise if resistor R6 is absent and R5 is adjusted to 6 kiloohms.

The operational relationships for FIG. 5b are of the same nature as Eqs. (1) and (2) but more complicated in expression. The sensitivity can again be made very high.

Figure 6A:
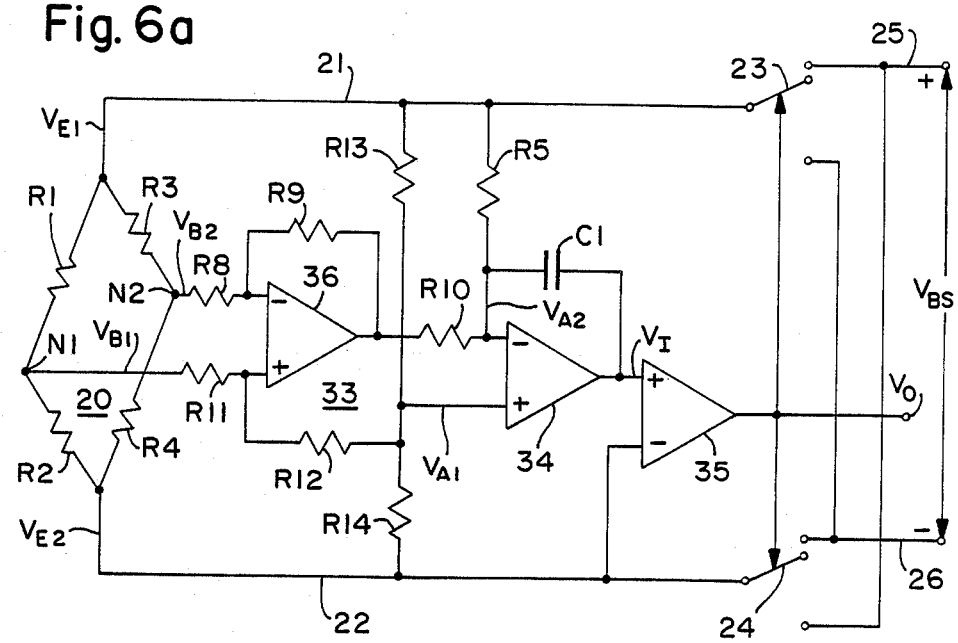
FIGS. 6a and 6b are circuit diagrams for embodiments of the converter of FIG. 3 in which there is an intermediate transfer operation.
Figure 6B:
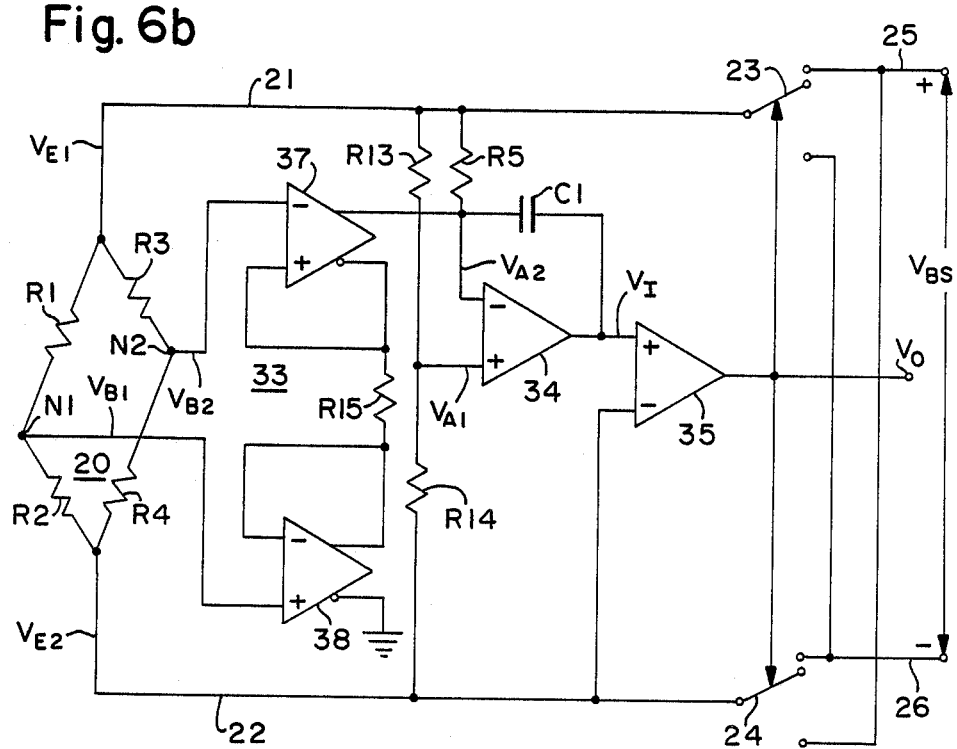

FIGS. 6a and 6b show embodiments of FIG. 3 in which sub-circuit 33 is present and in which amplifier 34 is a conventional op amp. In FIG. 6a, sub-circuit 33 consists of a conventional op amp 36 interconnected with resistors R8, R9, R10, R11, R12, R13, and R14 in the manner shown. In FIG. 6b, sub-circuit 33 consists of resistors R13, R14, and R15 interconnected with floating op amps 37 and 38 as shown. The currents flowing at the non-inverting and inverting outputs of each of op amps 37 and 38 are approximately equal in magnitude but opposite in direction. The following relationships apply to FIG. 6b:

$$I_C \approx \left(\frac{R_{13}}{R_{13} + R_{14}}\right)\frac{V_{BS}}{R_5} + \left[\left(\frac{R_1}{R_1 + R_2}\right) - \left(\frac{R_3}{R_3 + R_4}\right)\right]\frac{V_{BS}}{R_{15}} \quad (3)$$

$$f \approx \frac{1}{4R_5C_1}\left(\frac{R_{13}}{R_{14}}\right) + \frac{1}{4R_{15}C_1}\left(\frac{R_{13} + R_{14}}{R_{14}}\right)\left[\left(\frac{R_1}{R_1 + R_2}\right) - \left(\frac{R_3}{R_3 + R_4}\right)\right] \quad (4)$$

where $R_{13}$, $R_{14}$, and $R_{15}$ are the respective values for resistors R13-R15. If the two resistor ratios in the second term in Eq. (4) have the same nominal values, the first term is $f_O$. The second term in Eq. (4) is $\Delta f$.

While the invention has been described with reference to particular embodiments, this description is solely for the purpose of illustration and is not to be construed as limiting the scope of the invention claimed below. For example, a signal current at the output frequency could be impressed on the negative external supply line rather than on the positive external supply line. Thus, various changes, modifications, and applications may be made by those skilled in the art without departing from the true scope and spirit of the invention as defined in the appended claims.

I claim:

1. A circuit employed with a resistance bridge formed with a group of bridge resistors subject to an effect that causes a change in resistance of at least one of the resistors, the bridge providing a pair of bridge signals that are representative of the change in resistance and are thereby representative of the effect, the circuit comprising:
  first and second energizing lines that respectively transmit first and second energizing voltages to the bridge;
  intermediate means, including an integrator, for converting the bridge signals into a charging current and for integrating the charging current to produce an integrated voltage;
  a comparator for comparing the integrated voltage with the second energizing voltage to produce an output voltage representative of the comparison;
  first and second main supply lines for differentially transmitting a main supply voltage; and
  switching means responsive to the output voltage for coupling the first and second energizing lines either to the first and second supply lines, respectively, when the output voltage is greater than the second energizing voltage or to the second and first supply lines, respectively, when the output voltage is less than the second energizing voltage, the polarity of the charging current varying with the polarity of the difference between the energizing voltages so that the output voltage is at an output frequency representative of the effect.

2. A circuit as in claim 1 wherein the bridge resistors comprise:
  a first resistor connected between the first energizing line and a first node;
  a second resistor connected between the first node and the second energizing line;
  a third resistor connected between the first energizing line and a second node; and
  a fourth resistor connected between the second node and the second energizing line, the nodes providing the bridge voltages.

3. A circuit as in claim 2 wherein the integrator comprises:
  a high-gain amplifier that forces a first amplifier voltage to closely approach a second amplifier voltage representative of one of the bridge signals, the amplifier having a non-inverting input for receiving the first amplifier voltage, an inverting input for receiving the second amplifier voltage, and a main output for providing the integrated voltage; and
  a capacitive element coupled between the output and the inverting input for receiving the charging current.

4. A circuit as in claim 3 wherein the first and second nodes are respectively coupled to the non-inverting and inverting inputs.

5. A circuit as in claim 4 wherein the amplifier is an operational amplifier.

6. A circuit as in claim 5 wherein the intermediate means includes a fifth resistor physically separate from the four bridge resistors, the fifth resistor coupled between the first energizing line and the inverting input.

7. A circuit as in claim 4 wherein the amplifier is a floating operational amplifier having a further output for providing a further voltage, the currents of the integrated voltage and the further voltage being largely equal in magnitude but flowing in opposite directions relative to the amplifier, the further output coupled to the non-inverting input.

8. A circuit as in claim 7 wherein the intermediate means includes fifth and sixth resistors physically separate from the four bridge resistors, the fifth resistor coupled between the first energizing line and the inverting input, the sixth resistor coupled between the second energizing line and the non-inverting input.

9. A circuit as in claim 3 wherein the intermediate means includes means for operating on the bridge signals to produce the amplifier voltages according to a desired transfer function.

10. A circuit as in claim 2 wherein the four bridge resistors have substantially equal nominal values.

11. A circuit as in claim 3 further including:
  a pair of further supply lines for differentially providing the integrator and comparator with a further supply voltage having a magnitude greater than that of the main supply voltage; and
  voltage reduction means responsive to the further supply voltage for generating the main supply voltage.

12. A circuit as in claim 11 further including output means responsive to the output voltage for providing a selected one of the further supply lines with a signal current at the output frequency.

13. A circuit as in claim 12 wherein the output means is a resistor coupled between the selected further supply line and the comparator.

14. A circuit as in claim 13 further including means for regulating the further supply voltage so as to be substantially constant.

15. A circuit as in claim 12 wherein the first and second nodes are respectively coupled to the non-inverting and inverting inputs.

* * * * *